United States Patent
Zhou et al.

(10) Patent No.: US 10,700,705 B2
(45) Date of Patent: Jun. 30, 2020

(54) ENCODING AND DECODING METHOD AND TERMINAL

(71) Applicant: HUAWEI TECHNOLOGIES CO., LTD., Shenzhen, Guangdong (CN)

(72) Inventors: Yue Zhou, Hangzhou (CN); Rong Li, Hangzhou (CN); Hejia Luo, Hangzhou (CN); Huazi Zhang, Hangzhou (CN); Ying Chen, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/521,391

(22) Filed: Jul. 24, 2019

(65) Prior Publication Data
US 2019/0349002 A1    Nov. 14, 2019

Related U.S. Application Data

(63) Continuation of application No. PCT/CN2017/117571, filed on Dec. 20, 2017.

(30) Foreign Application Priority Data

Jan. 25, 2017 (CN) .......................... 2017 1 0064225

(51) Int. Cl.
*G06F 11/00* (2006.01)
*G06F 11/30* (2006.01)
(Continued)

(52) U.S. Cl.
CPC ......... *H03M 13/098* (2013.01); *H03M 13/13* (2013.01); *H03M 13/6362* (2013.01); *H04L 1/0063* (2013.01)

(58) Field of Classification Search
CPC ........... H03M 13/098; H03M 13/6363; H03M 13/13; H04L 1/0063
See application file for complete search history.

(56) References Cited

U.S. PATENT DOCUMENTS

2009/0067543 A1* 3/2009 Hsiao .................. H04B 7/0617 375/298
2016/0079999 A1 3/2016 Shen et al.
(Continued)

FOREIGN PATENT DOCUMENTS

CN 103281166 A 9/2013
CN 104219019 A 12/2014
(Continued)

OTHER PUBLICATIONS

3GPP TS 36.212 V14.1.1 (Jan. 2017), "3rd Generation Partnership Project; Technical Specification Group Radio Access Network; Evolved Universal Terrestrial Radio Access (E-UTRA); Multiplexing and channel coding (Release 14)," Jan. 2017, 149 pages.
(Continued)

Primary Examiner — Samir W Rizk
(74) Attorney, Agent, or Firm — Fish & Richardson P.C.

(57) ABSTRACT

Embodiments of this application disclose encoding and decoding methods and apparatus related to the communications. One of the methods includes: obtaining, based on polar code rate matching, a subchannel corresponding to a punctured bit or a shortened bit; determine subchannels corresponding to an information bit and a check frozen bit that are different from the subchannel corresponding to the punctured bit or the shortened bit; determining that a subchannel corresponding to a frozen bit that is different from the subchannels corresponding to the information bit and the check frozen bit and the subchannel corresponding to the punctured bit or the shortened bit; performing, according to the subchannels corresponding to the information bit and the check frozen bit and the subchannel corresponding to the frozen bit, parity check encoding and polar encoding based on the information bit to obtain encoded information; and sending the encoded information.

12 Claims, 10 Drawing Sheets

(51) Int. Cl.
*G08C 25/00* (2006.01)
*H03M 13/00* (2006.01)
*H04L 1/00* (2006.01)
*H03M 13/09* (2006.01)
*H03M 13/13* (2006.01)

(56) References Cited

U.S. PATENT DOCUMENTS

| | | | | |
|---|---|---|---|---|
| 2016/0204811 | A1* | 7/2016 | Goela | H04B 1/123 |
| | | | | 375/260 |
| 2017/0047947 | A1* | 2/2017 | Hong | H03M 13/2906 |
| 2018/0026663 | A1* | 1/2018 | Wu | H03M 13/155 |
| | | | | 714/776 |
| 2019/0268025 | A1 | 8/2019 | Shen et al. | |

FOREIGN PATENT DOCUMENTS

| | | | |
|---|---|---|---|
| CN | 105227189 | A | 1/2016 |
| CN | 105680883 | A | 6/2016 |
| CN | 105743621 | A | 7/2016 |
| CN | 106230555 | A | 12/2016 |
| WO | 2014190915 | A1 | 12/2014 |

OTHER PUBLICATIONS

PCT International Search Report and Written Opinion issued in International Application No. PCT/CN2017/117571 dated Feb. 24, 2018, 18 pages (with English translation).
Office Action issued in Chinese Application No. 201710064225.7 dated Aug. 21, 2019, 5 pages.
Extended European Search Report issued in European Application No. 17894234.8 dated Jan. 22, 2020, 9 pages.
Huawei et al., "Summary of polar code design for control channels," 3GPP TSG RAN WG1 Meeting #86; R1-1700088, Spokane, USA, XP051207630, Jan. 16-20, 2017,10 pages.
Huawei et al., "Polar Code Construction for NR," 3GPP TSG RAN WG1 Meeting #86bis; R1-1608862, Lisbon, Portugal, XP051148916, Oct. 10-14, 2016, 8 pages.
Intel Corporation, "Polar code design," 3GPP TSG RAN WG1 Ad hob; R1-1700386, Spokane, USA, XP051207923, Jan. 16-20, 2017, 12 pages.
Office Action issued in Chinese Application No. 201910342791.9 dated Dec. 20, 2019, 6 pages.
R1-1611254—Huawei, HiSilicon, "Details of the Polar code design," 3GPP TSG RAN WG1 Meeting #87, Reno, USA, Nov. 10-14, 2016, 15 pages.
Search Report issued in Chinese Application No. 201910342791.9 dated Dec. 9, 2019, 2 pages.

* cited by examiner

Reliability, in descending order, of subchannels corresponding to Q

ENCODING AND DECODING METHOD AND TERMINAL

CROSS-REFERENCE TO RELATED APPLICATIONS

This application is a continuation of International Patent Application No. PCT/CN2017/117571 filed on Dec. 20, 2017, which claims priority to Chinese Patent Application No. 201710064225.7, filed on Jan. 25, 2017, The disclosures of the aforementioned applications are hereby incorporated by reference in their entireties.

TECHNICAL FIELD

This application relates to the communications field, and in particular, to an encoding and decoding method and a terminal.

BACKGROUND

In the 3rd Generation Partnership Project (3GPP) radio access network 1 (RAN 1) meeting #87, it is determined that a polar coding scheme is used for both uplink control information and downlink control information of an enhanced mobile broadband (eMBB). To improve polar decoding performance, an outer code having a check capability may be cascaded outside the polar. Currently, cascaded outer codes are classified into a cyclic redundancy check (CRC) code and a parity check (PC) code. A scheme in which the CRC code is used as an outer code is referred to as CRC-aided polar (CA-Polar), and a scheme in which the PC code is used as an outer code is referred to as PC polar.

The CA-polar scheme is as follows: On an encoding side, a subchannel of a frozen bit and a subchannel of an information bit are determined, bits that need to be transferred on the subchannel of the frozen bit and the subchannel of the information bit are determined, and then polar encoding is performed on all the bits. A bit transferred on the subchannel of the frozen bit may be a bit 0 or an agreed bit, and the bit transferred on the subchannel of the information bit may include an information bit and a CRC bit. On a decoding side, a CRC is performed on decoding values of a plurality of paths of a decoder, and a path on which the CRC succeeds is used as a decoding output result. The PC polar scheme is as follows: On an encoding side, subchannel of a frozen bit, a subchannel of a PC frozen bit, and a subchannel of an information bit are determined, bits that need to be transferred on the subchannel of the frozen bit, the subchannel of the PC frozen bit, and the subchannel of the information bit are determined, and then polar encoding is performed on all the bits. A bit transferred on the subchannel of the frozen bit may be a bit 0 or an agreed bit, the bit transferred on the subchannel of the PC frozen bit is a PC frozen bit, and the bit transferred on the subchannel of the information bit is an information bit. On a decoding side, a PC bit is distributed among information bits. In a middle stage of decoding, the PC bit may be used to provide an early termination. To be specific, if a decoding error occurs in any path when a decoding process is executed, the decoding process of the path is interrupted and the path is deleted, so that a path on which PC decoding succeeds is determined in a plurality of paths of the decoder. Currently, a simplified PC polar scheme is proposed, and is referred to as a simplified PC (Simplified PC-Polar, Sim-PC). In the Sim-PC scheme, a quasi-periodic feature of channel polarization is used; each period is used as a segment, and the PC frozen bit is selected in advance in each segment to simplify construction of the PC polar.

However, in the CA-polar, the CRC bit is cascaded at an end of information bits. Therefore, a check is performed after the information bits are decoded, and consequently, the CA-polar does not provide a capability of determining an early termination during decoding. In addition, the CRC bit always occupies a subchannel having highest reliability, and no enough space is left for encoding optimization, resulting in poor performance on the encoding side. A construction method of the PC polar is relatively complex, and a decoding result of a first path is output by default. However, an error may occur in the decoding result of the first path, resulting in poor performance on the decoding side. Performance of the Sim-PC is similar to that of the PC polar. FIG. 1 shows a comparison of block error rate (BLER) performance between the Sim-PC and the PC polar (referred to as PC for short in FIG. 1) when there are 120 information bits. In FIG. 1, cases in which lengths after encoding are 720 (120/720), 240 (120/240), and 360 (120/360) are included. At a signal-to-noise ratio, a lower block error rate indicates higher transmission reliability of a method at the signal-to-noise ratio. If a block error rate curve of a method drops more quickly (a slope becomes higher) with rising of the signal-to-noise ratio, it indicates that the method can reach higher transmission reliability more quickly with rising of the signal-to-noise ratio. It can be learned that, the Sim-PC has a slight performance loss in a high signal-to-noise ratio range at the decoding side.

SUMMARY

Embodiments of this application provide encoding and decoding methods and a terminal, to improve polar code decoding performance.

According to a first aspect, an embodiment of this application provides an encoding method, including: performing, by a transmit end, a cyclic redundancy check on to-be-encoded information, to obtain first encoded information; performing, by the transmit end, parity check encoding on the first encoded information, to obtain second encoded information; and performing, by the transmit end, polar encoding on the second encoded information, to obtain third encoded information and output the third encoded information to a receive end. In this way, on an encoding side, the transmit end performs both the cyclic redundancy check and the parity check encoding before the polar encoding, so that on a decoding side, the receive end outputs a decoding result obtained after the parity check encoding and the cyclic redundancy check succeed. In comparison with the prior art in which on an encoding side, only a cyclic redundancy check is performed or only parity check encoding is performed, and on a decoding side, a decoding result obtained after only the parity check succeeds or only the cyclic redundancy check succeeds is output, in this embodiment of this application, double encoding and double checks are performed. To be specific, CRC encoding is performed once only before PC polar encoding by using CRC-aided PC polar encoding, to improve an error detection capability during decoding, and improve polar code decoding performance.

In a possible design, the performing, by a transmit end, a cyclic redundancy check on to-be-encoded information, to obtain first encoded information includes: adding, by the transmit end, a cyclic redundancy check bit to an information bit of the to-be-encoded information, to obtain the first encoded information, where the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid in decoding. In this way, the first cyclic redundancy check bit may be used to check whether an error exists in the information bit, and the second cyclic redundancy check bit may be used to aid in the decoding, to ensure that a detection omission probability of output decoding values is as low as possible.

In a possible design, the performing, by the transmit end, parity check encoding on the first encoded information, to obtain second encoded information includes: allocating, by the transmit end, an information bit, a check frozen bit, and a frozen bit of the first encoded information to subchannels based on reliability of the subchannels, to obtain the second encoded information, where in the second encoded information, the information bit and the check frozen bit are allocated to subchannels having high reliability, and the frozen bit is allocated to a subchannel having low reliability. In this way, the information bit and the check frozen bit are allocated to the subchannels having high reliability, and the frozen bit is allocated to the subchannel having low reliability, to ensure that transmission performance of the information bit and the check frozen bit that are relatively important is higher than transmission performance of the frozen bit. In addition, FIG. 1a is a schematic diagram of a comparison between BLER performance of a decoding value in this application and BLER performance of decoding values in the prior art, where the decoding values in this application are output by the receive end on the decoding side while the cyclic redundancy check is performed and then the parity check encoding is performed on the encoding side, namely, at the transmit end; and the decoding values in the prior art are output on the decoding side while only the parity check encoding is performed on the encoding side. FIG. 1a shows BLER performance of decoding values in this application (PC CA) and the prior art (PC) when a quantity of information bits in the to-be-encoded information is 120, and quantities of bits after encoding are respectively 240, 360, and 720. A block error rate indicates transmission reliability of an encoding method. It can be learned from FIG. 1a that, in comparison with the encoding and decoding method in the prior art, at a same signal-to-noise ratio, the encoding and decoding method in this application has a lower block error rate, and the block error rate drops more quickly with rising of the signal-to-noise ratio. Therefore, the encoding and decoding method in this application has better encoding performance.

In a possible design, the performing, by the transmit end, parity check encoding on the first encoded information, to obtain second encoded information includes: allocating, by the transmit end, an information bit, a check frozen bit, and a frozen bit of the first encoded information to subchannels based on a quasi-periodic feature of subchannel polarization, to obtain the second encoded information. In this way, the transmit end may allocate the information bit, the check frozen bit, and the frozen bit of the first encoded information to the subchannels based on the quasi-periodic feature of the subchannel polarization, to obtain the second encoded information. In addition, FIG. 1b is a schematic diagram of a comparison between BLER performance of decoding values in this application and BLER performance of decoding values in the prior art, where the decoding values in this application are output by the receive end on the decoding side while the cyclic redundancy check is performed and then the parity check encoding is performed based on the quasi-periodic feature of the subchannel polarization by the transmit end on the encoding side, and the decoding values in the prior art are output on the decoding side while only the parity check encoding is performed on the encoding side. FIG. 1b shows BLER performance of decoding values in this application and the prior art when a quantity of information bits in the to-be-encoded information is 120, and quantities of bits after encoding are respectively 240, 360, and 720. A block error rate indicates transmission reliability of an encoding method. It can be learned from FIG. 1b that, in comparison with the encoding and decoding method (Sim-PC) in the prior art, at a same signal-to-noise ratio, the encoding and decoding (Sim-PC CA) method in this application has a much lower block error rate, and the block error rate drops more quickly with rising of the signal-to-noise ratio. Therefore, the encoding and decoding method in this application improves the encoding performance significantly.

In a possible design, the allocating, by the transmit end, an information bit, a check frozen bit, and a frozen bit of the first encoded information to subchannels based on a quasi-periodic feature of subchannel polarization includes: obtaining, by the transmit end, a reliability sequence of the subchannels, and obtaining, in a polar code rate matching manner, a subchannel corresponding to a punctured bit or a subchannel corresponding to a shortened bit; obtaining, by the transmit end, a subchannel segmentation point set for the subchannels based on a quasi-period of the subchannel polarization, to segment the subchannels; determining, by the transmit end, a sequence number set, of each segment, corresponding to subchannels that correspond to the information bit and the check frozen bit and that are different from the subchannel corresponding to the punctured bit or the subchannel corresponding to the shortened bit; and determining, by the transmit end, a subchannel that is in the subchannels and that is different from subchannels corresponding to the information bit, the check frozen bit, and the punctured bit as a subchannel of the frozen bit, or determining, by the transmit end, that a subchannel that is in the subchannels and that is different from subchannels corresponding to the information bit, the check frozen bit, and the shortened bit as a subchannel of the frozen bit. In this way, the transmit end may allocate the information bit, the check frozen bit, and the frozen bit of the first encoded information to the subchannels based on the quasi-periodic feature of the subchannel polarization, to obtain the second encoded information.

In a possible design, if a minimum value of the reliability sequence is 0, and a maximum value is N−1, then: when N=16, the segmentation point set is [7, 11]; or when N=32, the segmentation point set is [15, 23, 27]; or when N=64, the segmentation point set is [31, 47, 55, 59]; or when N=128, the segmentation point set is [63, 95, 111, 119, 123]; or when N=256, the segmentation point set is [127, 191, 223, 239, 247, 251]; or when N=512, the segmentation point set is [255, 383, 447, 479, 495, 503, 507]; or when N=1024, the segmentation point set is [511, 767, 895, 959, 991, 1007, 1015, 1019]; or when N=2048, the segmentation point set is [1023, 1535, 1791, 1919, 1983, 2015, 2031, 2039, 2043]; or when N=4096, the segmentation point set is [2047, 3071, 3583, 3839, 3967, 4031, 4065, 4079, 4087, 4091]. The transmit end may obtain, based on a shift register, segmentation points in segmentation point sets corresponding to different N values. A larger N value indicates more segmentation points in a segmentation point set.

In a possible design, subchannels corresponding to first $P_{fg}$ sequence numbers, subchannels corresponding to last $P_{fg}$ sequence numbers, or subchannels corresponding to middle $P_{fg}$ sequence numbers in the sequence number set of each segment are subchannels corresponding to check frozen bits, g is a segment sequence number, $P_{fg}$ is a nonnegative integer, and g is a positive integer greater than or equal to 1. In this way, the transmit end may determine that the subchannels corresponding to the first $P_{fg}$ sequence numbers, the subchannels corresponding to the last $P_{fg}$ sequence numbers, or the subchannels corresponding to the middle $P_{fg}$ sequence numbers in the subchannels corresponding to both the information bit and the check frozen bit that are in each segment are the subchannels corresponding to the check frozen bits.

According to a second aspect, an embodiment of this application provides a sending apparatus, including: a check unit, configured to perform a cyclic redundancy check on to-be-encoded information, to obtain first encoded information; and an encoding unit, configured to perform parity check encoding on the first encoded information, to obtain second encoded information, where the encoding unit is further configured to perform polar encoding on the second encoded information, to obtain third encoded information and output the third encoded information to a receive end.

In a possible design, the check unit is configured to add a cyclic redundancy check bit to an information bit of the to-be-encoded information, to obtain the first encoded information, where the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding.

In a possible design, the encoding unit is configured to allocate an information bit, a check frozen bit, and a frozen bit of the first encoded information to subchannels based on reliability of the subchannels, to obtain the second encoded information, and in the second encoded information, the information bit and the check frozen bit are allocated to a subchannel having high reliability, and the frozen bit is allocated to a subchannel having low reliability.

In a possible design, the encoding unit is configured to allocate an information bit, a check frozen bit, and a frozen bit of the first encoded information to subchannels based on a quasi-periodic feature of subchannel polarization, to obtain the second encoded information.

In a possible design, the encoding unit includes: an obtaining subunit, configured to obtain a reliability sequence of the subchannels, and obtain a subchannel corresponding to a punctured bit or a shortened bit in a polar code rate matching manner; a segmentation subunit, configured to obtain a subchannel segmentation point set for the subchannels based on a quasi-period of subchannel polarization, to segment the subchannels; and a determining subunit, configured to determine a sequence number set corresponding to subchannels in each segment that correspond to the information bit and the check frozen bit and that are different from the subchannel corresponding to the punctured bit or the subchannel corresponding to the shortened bit, where the determining subunit is further configured to: determine a subchannel that is in the subchannels and that is different from subchannels corresponding to the information bit, the check frozen bit, and the punctured bit as a subchannel of the frozen bit; or determine a subchannel that is in the subchannels and that is different from subchannels corresponding to the information bit, the check frozen bit, and the shortened bit as a subchannel of the frozen bit.

In a possible design, if a minimum value of the reliability sequence is 0, and a maximum value is N−1, then: when N=16, the segmentation point set is [7, 11]; or when N=32, the segmentation point set is [15, 23, 27]; or when N=64, the segmentation point set is [31, 47, 55, 59]; or when N=128, the segmentation point set is [63, 95, 111, 119, 123]; or when N=256, the segmentation point set is [127, 191, 223, 239, 247, 251]; or when N=512, the segmentation point set is [255, 383, 447, 479, 495, 503, 507]; or when N=1024, the segmentation point set is [511, 767, 895, 959, 991, 1007, 1015, 1019]; or when N=2048, the segmentation point set is [1023, 1535, 1791, 1919, 1983, 2015, 2031, 2039, 2043]; or when N=4096, the segmentation point set is [2047, 3071, 3583, 3839, 3967, 4031, 4065, 4079, 4087, 4091].

In a possible design, subchannels corresponding to first $P_{fg}$ sequence numbers, subchannels corresponding to last $P_{fg}$ sequence numbers, or subchannels corresponding to middle $P_{fg}$ sequence numbers in the sequence number set of each segment are subchannels corresponding to check frozen bits, g is a segment sequence number, $P_{fg}$ is a nonnegative integer, and g is a positive integer greater than or equal to 1.

According to a third aspect, an embodiment of this application provides a sending apparatus, including: a processor, configured to perform a cyclic redundancy check on to-be-encoded information, to obtain first encoded information, where the processor is further configured to perform parity check encoding on the first encoded information, to obtain second encoded information, and the processor is further configured to perform polar encoding on the second encoded information, to obtain third encoded information and output the third encoded information to a receive end.

In a possible design, the processor is configured to add a cyclic redundancy check bit to an information bit of the to-be-encoded information, to obtain the first encoded information, where the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding.

In a possible design, the processor is configured to allocate an information bit, a check frozen bit, and a frozen bit of the first encoded information to subchannels based on reliability of the subchannels, to obtain the second encoded information, and in the second encoded information, the information bit and the check frozen bit are allocated to a subchannel having high reliability, and the frozen bit is allocated to a subchannel having low reliability.

In a possible design, the processor is configured to allocate an information bit, a check frozen bit, and a frozen bit of the first encoded information to subchannels based on a quasi-periodic feature of subchannel polarization, to obtain the second encoded information.

In a possible design, the processor is further configured to: obtain a reliability sequence of the subchannels, and obtain a subchannel corresponding to a punctured bit or a shortened bit in a polar code rate matching manner; obtain a subchannel segmentation point set for the subchannels based on a quasi-period of subchannel polarization, to segment the subchannels; determine a sequence number set corresponding to subchannels in each segment that correspond to the information bit and the check frozen bit and that are different from the subchannel corresponding to the punctured bit or the subchannel corresponding to the shortened bit; and determine a subchannel that is in the subchannels and that is different from subchannels corresponding to the information bit, the check frozen bit, and the punctured bit as a subchannel of the frozen bit, or determine a subchannel that is in the subchannels and that is different from subchannels corresponding to the information bit, the check frozen bit, and the shortened bit as a subchannel of the frozen bit.

In a possible design, if a minimum value of the reliability sequence is 0, and a maximum value is N−1, then: when N=16, the segmentation point set is [7, 11]; or when N=32, the segmentation point set is [15, 23, 27]; or when N=64, the segmentation point set is [31, 47, 55, 59]; or when N=128, the segmentation point set is [63, 95, 111, 119, 123]; or when N=256, the segmentation point set is [127, 191, 223, 239, 247, 251]; or when N=512, the segmentation point set is [255, 383, 447, 479, 495, 503, 507]; or when N=1024, the segmentation point set is [511, 767, 895, 959, 991, 1007, 1015, 1019]; or when N=2048, the segmentation point set is [1023, 1535, 1791, 1919, 1983, 2015, 2031, 2039, 2043]; or when N=4096, the segmentation point set is [2047, 3071, 3583, 3839, 3967, 4031, 4065, 4079, 4087, 4091].

In a possible design, subchannels corresponding to first $P_{fg}$ sequence numbers, subchannels corresponding to last $P_{fg}$ sequence numbers, or subchannels corresponding to middle $P_{fg}$ sequence numbers in the sequence number set of each segment are subchannels corresponding to check frozen bits, g is a segment sequence number, $P_{fg}$ is a nonnegative integer, and g is a positive integer greater than or equal to 1.

According to a fourth aspect, an embodiment of the present disclosure provides an apparatus. The apparatus exists in a form of a chip product, and a structure of the apparatus includes a processor and a memory. The memory is configured to: couple to the processor, and store a program instruction and data that are necessary for the apparatus, and the processor is configured to execute the program instruction stored in the memory, so that the apparatus performs a function of the sending apparatus in the foregoing method.

According to a fifth aspect, an embodiment of the present disclosure provides a sending apparatus. The sending apparatus may implement a function performed by the sending apparatus in the foregoing method embodiment. The function may be implemented by hardware or may be implemented by hardware executing corresponding software. The hardware or the software includes one or more modules corresponding to the function.

In a possible design, a structure of the sending apparatus includes a processor and a communications interface. The processor is configured to support the sending apparatus in performing a corresponding function in the foregoing method. The communications interface is configured to support communication between the sending apparatus and another network element. The sending apparatus may further include a memory. The memory is configured to: couple to the processor, and store a program instruction and data that are necessary for the sending apparatus.

According to a sixth aspect, an embodiment of the present disclosure provides a computer readable storage medium, including an instruction. When the instruction runs on a computer, any one of the methods according to the first aspect is performed.

According to a seventh aspect, an embodiment of the present disclosure provides a computer program product including an instruction. When the instruction runs on a computer, the computer performs any one of the methods according to the first aspect.

According to an eighth aspect, an embodiment of this application provides a decoding method, including: obtaining, by a receive end by using a parity check successive cancellation list (PC-SCL) decoder, decoding values of paths after to-be-decoded information is decoded; and performing, by the receive end, a cyclic redundancy check on the paths, to obtain an information bit of a path passing the cyclic redundancy check. In this way, the receive end may output the information bit of the path passing the cyclic redundancy check in the decoding values of the paths of the PC-SCL. In comparison with the prior art in which a decoding value of a first path of the PC-SCL is output, and an error may exist in the decoding value of the first path, PC-SCL decoding and a CRC check provided in this embodiment of this application can further reduce an error probability of decoding values, so as to improve decoding performance of the polar code.

In a possible design, for each of the paths, a decoding value of the path includes an information bit and a cyclic redundancy check bit of the to-be-decoded information, the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding. In this way, the first cyclic redundancy check bit may be used to check whether an error exists in the information bit, and the second cyclic redundancy check bits may be used to aid in the decoding, to ensure that a detection omission probability of output decoding values is as low as possible.

In a possible design, the performing, by the receive end, a cyclic redundancy check on the paths, to obtain an information bit of a path passing the cyclic redundancy check includes: selecting, by the receive end, any path by using the second cyclic redundancy check bit to aid the PC-SCL decoder, checking an information bit of the any path by using the first cyclic redundancy check bit in the any path, and determining, when a result of the checking an information bit of the any path is correct, the information bit as the information bit of the path passing the cyclic redundancy check. In this way, the receive end may determine a path, of the PC-SCL decoder, whose decoding values are to be output. In comparison with the prior art in which the decoding values of the first path of the PC-SCL are output, and an error may exist in the decoding values of the first path, the encoding and decoding method provided in this embodiment of this application can reduce an error probability of the decoding values, to further improve polar code decoding performance.

According to a ninth aspect, an embodiment of this application provides a receiving apparatus, including: an obtaining unit, configured to obtain, by using a PC-SCL decoder, decoding values of paths after to-be-decoded information is decoded; and a check unit, configured to perform a cyclic redundancy check on the paths, to obtain an information bit of a path passing the cyclic redundancy check.

In a possible design, for each of the paths, a decoding value of the path includes an information bit and a cyclic redundancy check bit of the to-be-decoded information, the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding.

In a possible design, the check unit is configured to: select any path by using the second cyclic redundancy check bit to aid the PC-SCL decoder, check an information bit of the any path by using the first cyclic redundancy check bit in the any path, and determine, when a result of the checking an information bit of the any path is correct, the information bit as the information bit of the path passing the cyclic redundancy check.

According to a tenth aspect, an embodiment of this application provides a receiving apparatus, including: a processor, configured to obtain, by using a PC-SCL decoder, decoding values of paths after to-be-decoded information is decoded, where the processor is further configured to perform a cyclic redundancy check on the paths, to obtain an information bit of a path passing the cyclic redundancy check.

In a possible design, for each of the paths, a decoding value of the path includes an information bit and a cyclic redundancy check bit of the to-be-decoded information, the cyclic redundancy check bit includes a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding.

In a possible design, the processor is configured to: select any path by using the second cyclic redundancy check bit to aid the PC-SCL decoder, check an information bit of the any path by using the first cyclic redundancy check bit in the any path, and determine, when a result of the checking an information bit of the any path is correct, the information bit as the information bit of the path passing the cyclic redundancy check.

According to an eleventh aspect, an embodiment of the present disclosure provides an apparatus. The apparatus exists in a form of a chip product, and a structure of the apparatus includes a processor and a memory. The memory is configured to: couple to the processor, and store a program instruction and data that are necessary for the apparatus, and the processor is configured to execute the program instruction stored in the memory, so that the apparatus performs a function of the receiving apparatus in the foregoing method.

According to a twelfth aspect, an embodiment of the present disclosure provides a receiving apparatus. The receiving apparatus may implement a function performed by the receiving apparatus in the foregoing method embodiment. The function may be implemented by hardware or may be implemented by hardware executing corresponding software. The hardware or the software includes one or more modules corresponding to the function.

In a possible design, a structure of the receiving apparatus includes a processor and a communications interface. The processor is configured to support the receiving apparatus in performing a corresponding function in the foregoing method. The communications interface is configured to support communication between the receiving apparatus and another network element. The receiving apparatus may further include a memory. The memory is configured to: couple to the processor, and store a program instruction and data that are necessary for the receiving apparatus.

According to a thirteenth aspect, an embodiment of the present disclosure provides a computer readable storage medium, including an instruction. When the instruction runs on a computer, the computer performs any one of the methods according to the eighth aspect.

According to a fourteenth aspect, an embodiment of the present disclosure provides a computer program product including an instruction. When the instruction runs on a computer, the computer performs any one of the methods according to the eighth aspect.

In this way, on the encoding side, the transmit end performs both the cyclic redundancy check and the parity check encoding before the polar encoding, and on the decoding side, the receive end outputs a decoding result obtained after the parity check succeeds and the cyclic redundancy check succeeds. In comparison with the prior art in which on the encoding side, only the cyclic redundancy check is performed or only the parity check encoding is performed, and on the decoding side, a decoding result obtained after only the parity check encoding succeeds or the cyclic redundancy check succeeds is output, in this embodiment of this application, double encoding and double checks are performed. To be specific, CRC encoding is performed once only before the PC polar encoding by using CRC-aided PC polar encoding, and an operation of selecting a path by using a CRC is added only after PC-SCL decoding by using CRC-aided PC polar decoding, to improve an error detection capability during decoding, and improve polar code decoding performance.

DESCRIPTION OF EMBODIMENTS

Embodiments of this application may be applied to a scenario in which polar encoding and decoding are performed on an information bit, for example, may be applied to a scenario in which polar encoding and decoding are performed on uplink control information and downlink control information of eMBB, or may be applied to another scenario such as channel coding in 5.1.3 of Telecommunication Standard 36.212 and a channel coding part of uplink control information, downlink control information, and a sidelink channel. This is not limited in the embodiments of this application.

Figure 1:
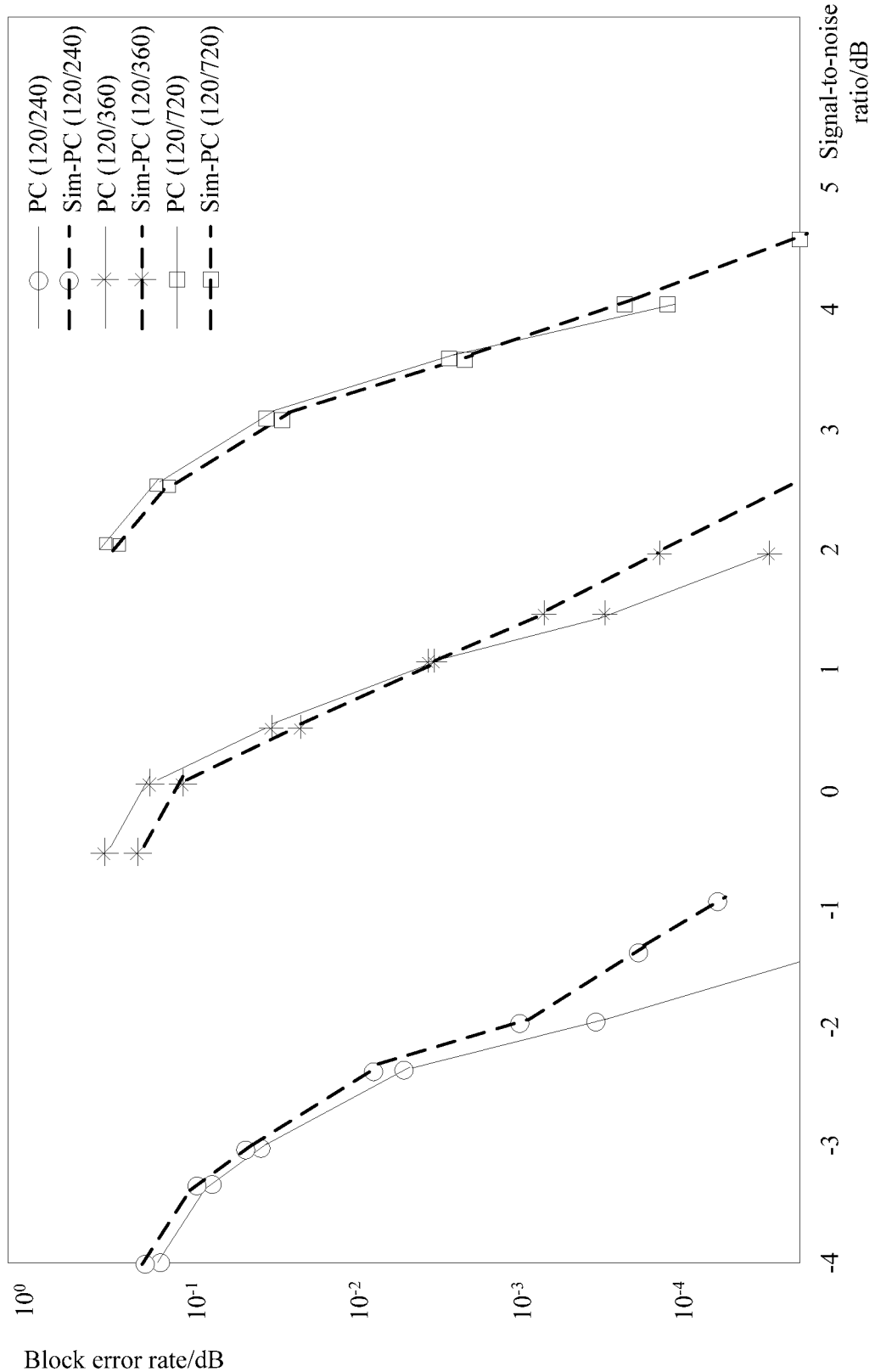
FIG. 1 is a schematic diagram of performance of Sim-PC and PC polar in the prior art.
Figure 1A:
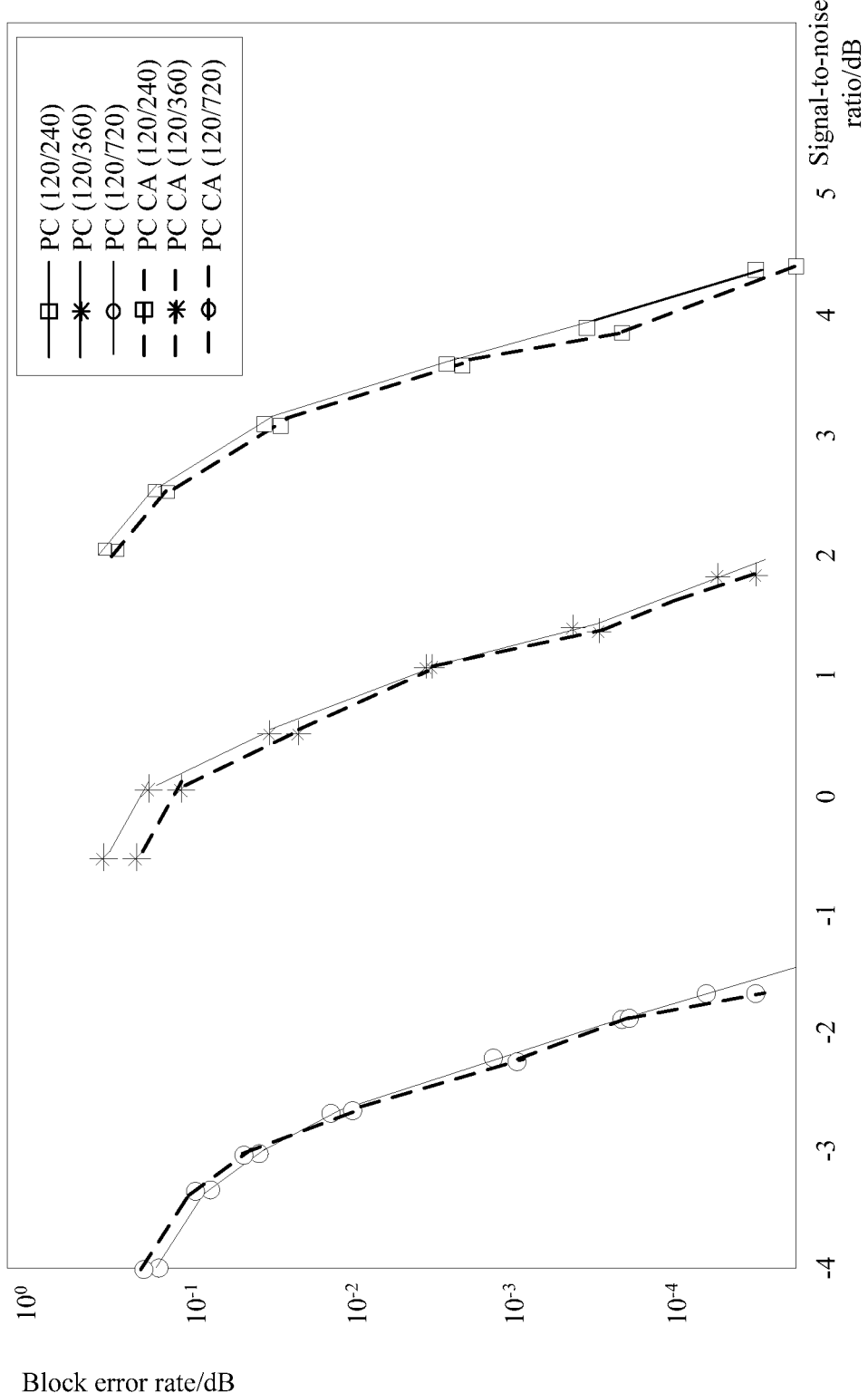
FIG. 1a is a schematic diagram of performance of output decoding values of PC and PC CA according to an embodiment of this application.
Figure 1B:
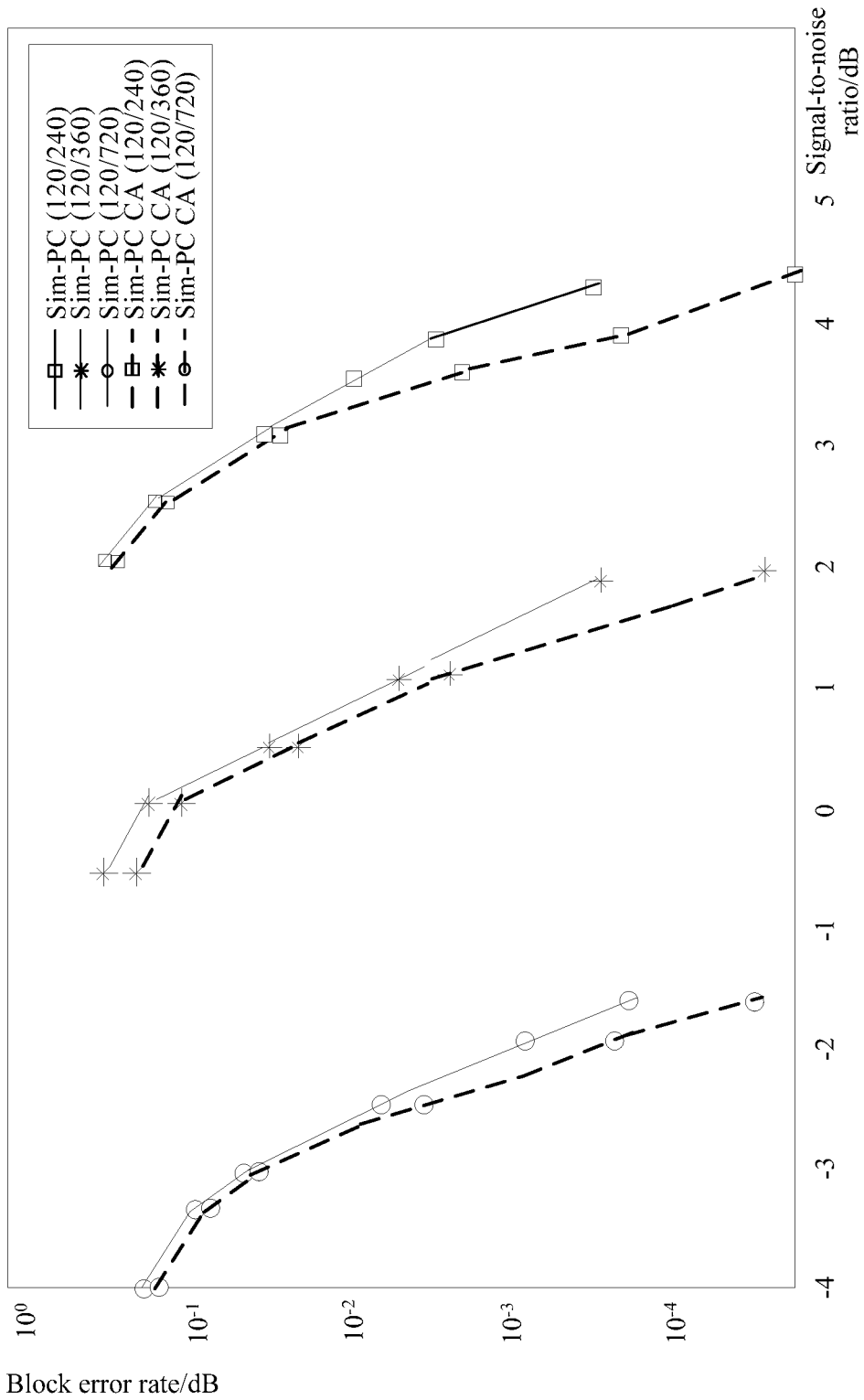
FIG. 1b is a schematic diagram of performance of output decoding values of Sim-PC and Sim-PC CA according to an embodiment of this application.
Figure 2:
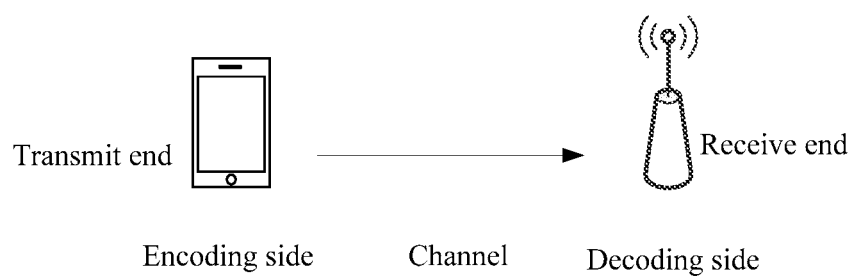
FIG. 2 is a schematic diagram of a system architecture according to an embodiment of this application.

A system in the embodiments of this application may include a transmit end and a receive end. FIG. 2 is a schematic diagram of a system architecture of a transmit end and a receive end. The transmit end is an encoding side, and may be configured to encode and output encoded information, and the encoded information is transmitted to a decoding side on a channel. The receive end is the decoding side, and may be configured to: receive the encoded information sent by the transmit end and decode the encoded information. The transmit end and the receive end may be terminals, servers, base stations, or other devices capable of encoding and decoding. This is not limited in this application. The terminal may be a personal computer (PC), a mobile phone, a tablet computer (pad), an intelligent learning machine, an intelligent game console, an intelligent television, smart glasses, a smartwatch, or the like.

Figure 3:
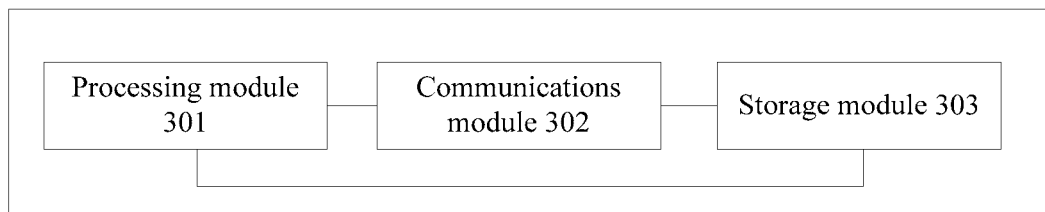
FIG. 3 is a schematic diagram of an internal structure of a transmit end according to an embodiment of this application.

FIG. 3 is a schematic diagram of an internal structure of a transmit end according to the present disclosure. In the present disclosure, the transmit end may include a processing module 301, a communications module 302, and a storage module 303. The processing module 301 is configured to control a hardware apparatus, application program software, and the like of each part of the transmit end. The communications module 302 is configured to receive, in a communication manner such as Wireless Fidelity (Wi-Fi), an instruction sent by another device, or may send data of the transmit end to another device. The storage module 303 is configured to perform software program storage, data storage, software running, and the like of the transmit end.

Figure 4:
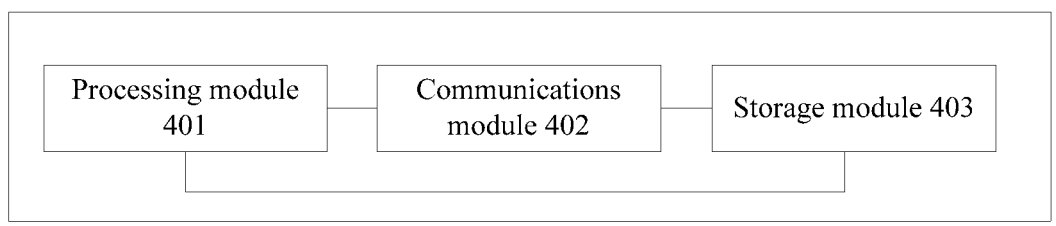
FIG. 4 is a schematic diagram of an internal structure of a receive end according to an embodiment of this application.

FIG. 4 is a schematic diagram of an internal structure of a receive end according to the present disclosure. In the present disclosure, the receive end may include a processing module 401, a communications module 402, and a storage module 403. The processing module 401 is configured to control a hardware apparatus, application program software, and the like of each part of the receive end. The communications module 402 is configured to receive, in a communication manner such as Wi-Fi, an instruction sent by another device, or may send data of the receive end to another device. The storage module 403 is configured to perform software program storage, data storage, software running, and the like of the receive end.

An embodiment of this application provides an encoding and decoding method, and a basic idea of the method is as follows: On an encoding side, a transmit end performs a cyclic redundancy check on to-be-encoded information, to obtain first encoded information, then performs parity check encoding on the first encoded information, to obtain second encoded information, and after that, performs polar encoding on the second encoded information, to obtain third encoded information and output the third encoded information to a receive end. On a decoding side, the receive end obtains decoding values of the third encoded information in paths by using a decoder, and then performs a cyclic redundancy check on the decoding values of the paths, to obtain an information bit of a path passing the cyclic redundancy check, namely, a finally output decoding result.

Figure 5:
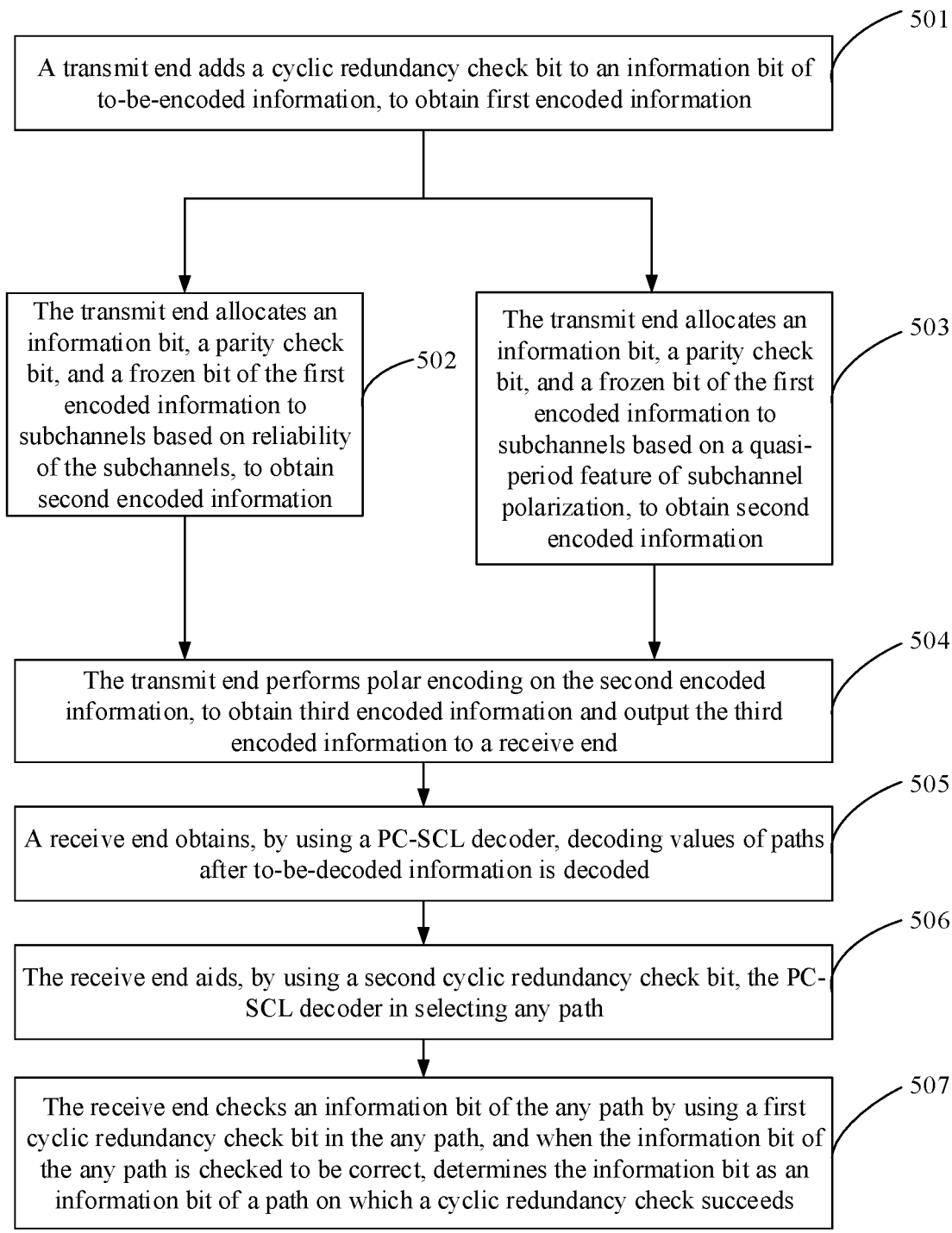
FIG. 5 is a schematic flowchart of an encoding and decoding method according to an embodiment of this application.

An embodiment of this application provides an encoding and decoding method, as shown in FIG. 5, the method includes the following steps.

501. The transmit end adds a cyclic redundancy check bit to an information bit of the to-be-encoded information, to obtain the first encoded information, and then performs step 502 or step 503.

For example, if a length of the information bit of the to-be-encoded information is 120 bits, and a length of the cyclic redundancy check bit is 16 bits, a length of an information bit of the first encoded information is 136 bits, that is, the information bit of the first encoded information includes the information bits of the to-be-encoded information and the cyclic redundancy check bit.

The cyclic redundancy check bit may include a first cyclic redundancy check bit and a second cyclic redundancy check bit, the first cyclic redundancy check bit is obtained based on the information bit, the second cyclic redundancy check bit is obtained based on the information bit and the first cyclic redundancy check bit, the first cyclic redundancy check bit is used to check the information bit, and the second cyclic redundancy check bit is used to aid decoding. A length (degree) of the first cyclic redundancy check bit may be greater than that of the second cyclic redundancy check bit. Usually, specific forms of a CRC polynomial and bit lengths of the first cyclic redundancy check bit and the second cyclic redundancy check bit are different, and check capabilities of the first cyclic redundancy check bit and the second cyclic redundancy check bit are different. Therefore, in comparison with a conventional cyclic redundancy check bit including only one type of check bit, the foregoing cyclic redundancy check bit including the first cyclic redundancy check bit and the second cyclic redundancy check bit in this embodiment of this application may ensure a lower false alarm probability and/or a lower detection omission probability.

To be specific, the transmit end may perform double CRC encoding during encoding on the encoding side. It is assumed that the information bits of the first encoded information are Info+CRC1+CRC2, where Info is the information bit of the to-be-encoded information; CRC1 is the first cyclic redundancy check bit, and CRC1 may be calculated based on the Info; CRC2 is the second cyclic redundancy check bit and may be calculated based on Info+CRC1; and a length of the CRC1 may be greater than that of the CRC2. The receive end may decode the information bit and the cyclic redundancy check bit in each path by using a PC-SCL decoder on the decoding side. According to the example in this paragraph, the decoder may obtain, through decoding, Info+CRC1+CRC2 of each path. The PC-SCL decoder checks correctness of Info+CRC1 by using CRC2 of each path, to select a path and output Info+CRC1. Then, the receive end detects, by using CRC1 of the path, whether an error exists in Info of the path, and feeds back correctness information or error information to an upper layer of a physical layer.

Certainly, the transmit end may alternatively not add the second cyclic redundancy check bit on the encoding side. In this case, on a decoding side, after obtaining, through decoding the information bit and the first cyclic redundancy check bit in each path by using the PC-SCL decoder on the decoding side, the receive end may directly output the information bit and the first cyclic redundancy check bit of the first path, and determine whether there is an error in the information bit by using the first cyclic redundancy check bit.

502. The transmit end allocates information bit, a check frozen bit, and a frozen bit of the first encoded information to subchannels based on reliability of the subchannels, to obtain the second encoded information, and then performs step 504.

In the second encoded information, the information bit and the check frozen bit may be allocated to a subchannel having high reliability, and the frozen bit may be allocated to a subchannel having low reliability. The check frozen bit may be a PC frozen bit.

Figure 6:
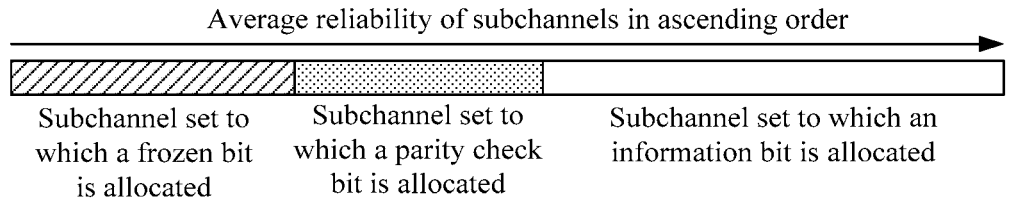
FIG. 6 is a schematic diagram of a reliability status of subchannels according to an embodiment of this application.

For example, FIG. 6 shows a manner of sorting the subchannels in ascending order of reliability. On average, reliability of a subchannel set for placing the frozen bit is lowest; for remaining channels, on average, reliability of a subchannel set for placing the information bit of the second encoded information is highest, and reliability of a subchannel for placing the PC frozen bit is between reliability of a subchannel to which the frozen bit is allocated and reliability of a subchannel to which the information bit is allocated. It should be noted that, it is also possible that some PC frozen bits are placed on subchannels with higher reliability than a subchannel on which an information bit is placed, and the reliability of the subchannel set for placing the frozen bit is always lowest.

Figure 7:
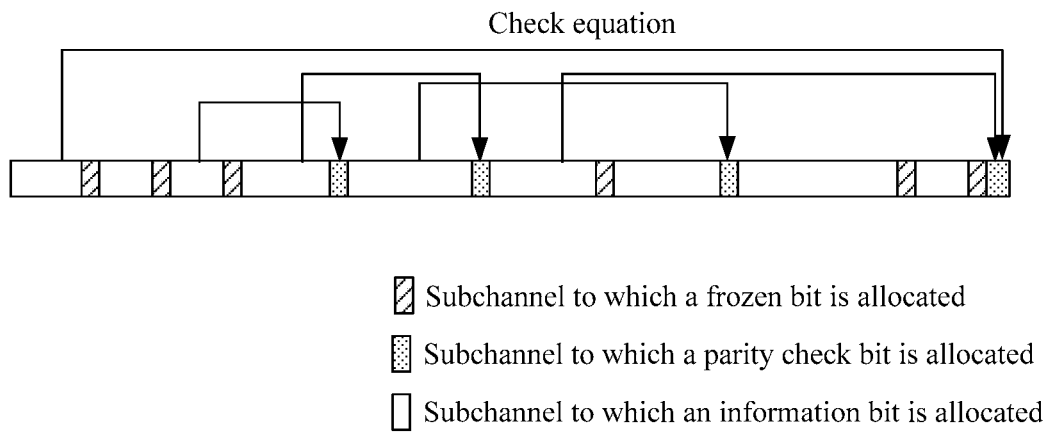
FIG. 7 is a schematic diagram of allocation of subchannels according to an embodiment of this application.

According to the foregoing manner of sorting the subchannels, subchannels to which the information bit, the PC frozen bit, and the frozen bit of the second encoded information of the transmit end are allocated may be shown in FIG. 7. FIG. 7 shows a manner of sorting subchannels to which the information bit is allocated, subchannels to which the PC frozen bit is allocated, and subchannels to which the frozen bit is allocated. The transmit end may obtain PC frozen bits corresponding to different information bits based on the different information bits and check equations (PC function), and a set of a plurality of different information bits may correspond to one PC frozen bit. Therefore, at the receive end, whether corresponding information bits are correct may be checked based on different PC frozen bits and PC functions.

503. The transmit end allocates an information bit, a check frozen bit, and a frozen bit of the first encoded information to subchannels based on a quasi-periodic feature of subchannel polarization, to obtain the second encoded information.

Figure 8:
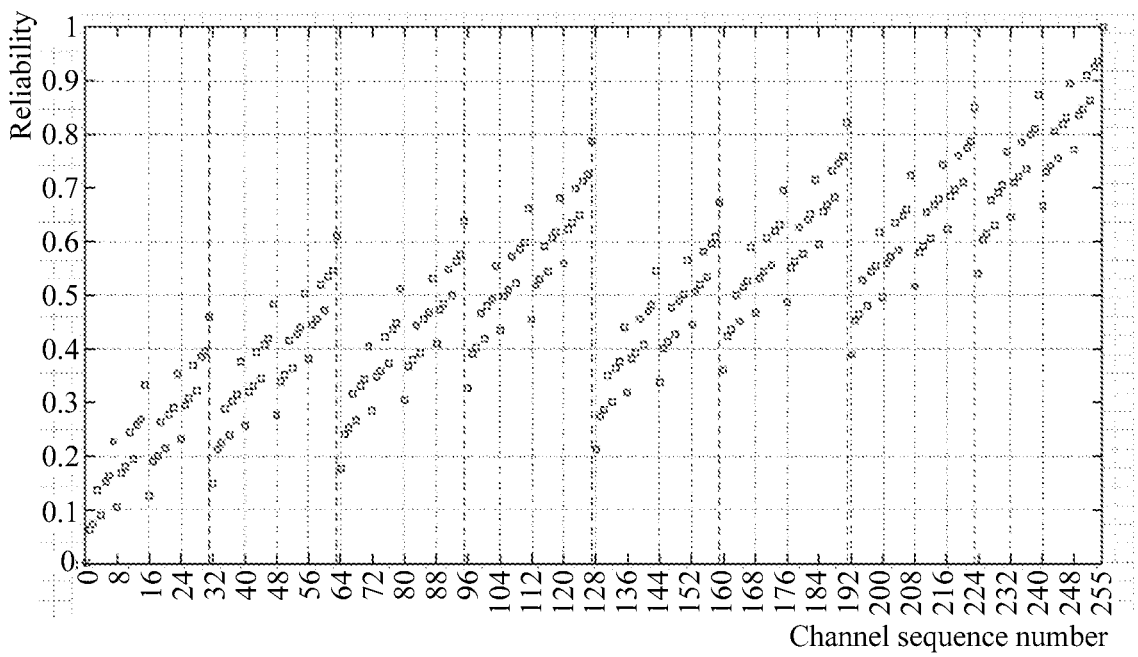
FIG. 8 is a schematic diagram of reliability of subchannels according to an embodiment of this application.

The quasi-periodic feature of the subchannel polarization specifically means that reliability of subchannels presents a periodic feature with a change of a subchannel sequence number. For example, FIG. 8 shows reliability of 256 subchannels, and a small square in the figure represents reliability of each subchannel. From different period scales, there is a change period from low to high in reliability of the subchannels. For example, 32 subchannels are used as a period in the figure, and a period boundary is marked with a dashed line. In each period, reliability of subchannels changes from low to high on a whole. For another example, if eight subchannels are used as a period, there is also a low-to-high trend from low to high in reliability of every eight subchannels, and average reliability of each period is improved relative to that of a previous period.

A basic idea of step 503 is: The transmit end obtains a reliability sequence of the subchannels, and obtains a subchannel corresponding to a punctured bit or a shortened bit in a polar code rate matching manner; then, the transmit end obtains a subchannel segmentation point set for the subchannels based on a quasi-period of subchannel polarization, to segment the subchannels; the transmit end determines a sequence number set corresponding to subchannels in each segment that correspond to the information bit and the PC frozen bit of the first encoded information and that are different from the subchannel corresponding to the punctured bit or the subchannel corresponding to the shortened bit; and the transmit end determines a subchannel that is in the subchannels and that is different from subchannels corresponding to the information bit, the PC frozen bit, and the punctured bit as a subchannel of the frozen bit, or the transmit end determines a subchannel that is in the subchannels and that is different from subchannels corresponding to the information bit, the PC frozen bit, and the shortened bit as a subchannel of the frozen bit.

Step 1.1: The transmit end obtains a reliability sequence Q of the subchannels.

The transmit end may obtain Q by using Gaussian approximation (GA) method, a density evolution (DE) method, a polar weight (PW) method, or another method.

Information in Q may include reliability values of the subchannels or a relative relationship (an order) of the reliability of the subchannels. The reliability values of the subchannels may be described by using error probability values of the subchannels. Therefore, Q may be a set of error probability values of the subchannels. A length of Q may be equal to a sum of a quantity (a size/length) K of information bits, a quantity PF of PC frozen bits, a quantity F of frozen bits, and a quantity P of punctured bits of the first encoded information, in other words, the length of Q is equal to K+PF+F+P. Alternatively, a length of Q may be equal to a difference between K+PF+F and a quantity S of shortened bits, in other words, the length of Q is equal to K+PF+F−S. S or P may be determined based on M and a sum of K, PF, and F, as shown in formulas 1-1 and 1-2:

$$2^{\lceil log2(M) \rceil} - M = P \qquad (1\text{-}1)$$

$$M - 2^{\lfloor log2(M) \rfloor} = S \qquad (1\text{-}2)$$

M indicates a length obtained after encoding.

For example (denoted as an example 1), assuming that K=40, PF=16, and M=400, P=$2^9$−400=112 may be obtained based on the formula (1-1). Therefore, there are 112 punctured bits, and the length of Q is 512 (400+112=512).

Alternatively, the length of Q may be equal to a length of a mother code, because the mother code length may be equal to the sum of a length of the information bit, a length of the PC frozen bit, a length of the frozen bit, and a length of the punctured bit of the first encoded information; or the mother code length may be equal to the sum of a length of the information bit, a length of the PC frozen bit, and a length of the frozen bit of the first encoded information minus a length of the shortened bit.

Step 1.2: The transmit end obtains the subchannels, to which the punctured bit or shortened bit is allocated, of subchannels corresponding to Q.

The transmit end may obtain the subchannels, to which the punctured bit or the shortened bit is allocated, of the subchannels corresponding to Q by using a puncturing scheme. The puncturing scheme may be a bit index reverse (BIV) scheme or another shortening/puncturing rate matching scheme.

In this embodiment of this application, obtaining the subchannels to which the punctured bit is allocated is used as an example for description. According to example 1, it is assumed that, the subchannels to which 112 punctured bits are allocated, that are of the subchannels corresponding to Q, and that are obtained by the transmit end by using the BIV shortening scheme may have the following sequence numbers: [7 11 15 19, 23, 27, 31, 39, 43, 47, 51, 55, 59, 63, 71, 75, 79, 83, 87, 91, 95, 103, 107, 111, 115, 119, 123, 127, 135, 139, 143, 147, 151, 155, 159, 167, 171, 175, 179, 183, 187, 191, 199, 203, 207, 211, 215, 219, 223, 231, 235, 239, 243, 247, 251, 255, 263, 267, 271, 275, 279, 283, 287, 295, 299, 303, 307, 311, 315, 319, 327, 331, 335, 339, 343, 347, 351, 359, 363, 367, 371, 375, 379, 383, 391, 395, 399, 403, 407, 411, 415, 423, 427, 431, 435, 439, 443, 447, 455, 459, 463, 467, 471, 475, 479, 487, 491, 495, 499, 503, 507, 511].

Step 1.3: The transmit end obtains sequence numbers of subchannels, to which the information bit and the check frozen bit of the first encoded information are allocated, of the subchannels corresponding to Q.

Figure 9:
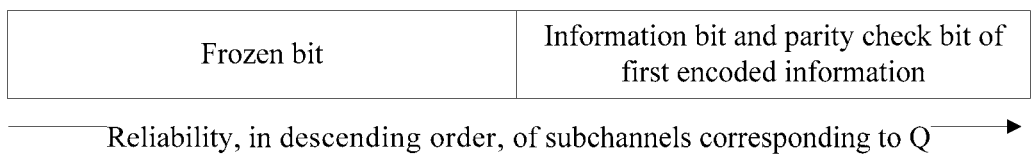
FIG. 9 is a schematic diagram of a reliability status of subchannels corresponding to a reliability sequence Q according to an embodiment of this application.

In the subchannels corresponding to Q, except a subchannel occupied by the punctured bit, some subchannels having high reliability are occupied by the information bit and the PC frozen bit of the first encoded information, and some subchannels having low reliability are occupied by the frozen bit. FIG. 9 shows descending order of reliability of subchannels that are in the subchannels corresponding to Q and that are occupied by other bits other than the punctured bit. A process of obtaining the subchannels to which the information bit and the PC frozen bit of the first encoded information are allocated may be divided into four steps: a, b, c, and d.

(a) Segment the subchannels corresponding to Q.

Based on a segmentation algorithm of the subchannels, if a maximum value of sequence numbers of the subchannels corresponding to Q is N, then:

when N=16, a segmentation point set is [7, 11]; or when N=32, a segmentation point set is [15, 23, 27]; or when N=64, a segmentation point set is [31, 47, 55, 59]; or when N=128, a segmentation point set is [63, 95, 111, 119, 123]; or when N=256, a segmentation point set is [127, 191, 223, 239, 247, 251]; or when N=512, a segmentation point set is [255, 383, 447, 479, 495, 503, 507]; or when N=1024, a segmentation point set is [511, 767, 895, 959, 991, 1007, 1015, 1019]; or when N=2048, a segmentation point set is [1023, 1535, 1791, 1919, 1983, 2015, 2031, 2039, 2043]; or when N=4096, a segmentation point set is [2047, 3071, 3583, 3839, 3967, 4031, 4065, 4079, 4087, 4091].

Figure 10:
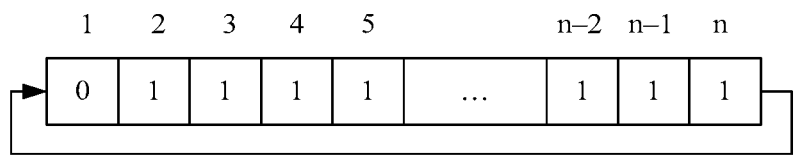
FIG. 10 is a schematic diagram of a shift register according to an embodiment of this application.

The foregoing segmentation point set may be generated by the transmit end by using a shift register having a length n=$\log_2(N)$, or may be directly stored by the transmit end in a form of a table. If the segmentation point set is generated by using the shift register, for example, as shown in FIG. 10, a first bit of the shift register may be initialized to 0, and remaining bits are 1. In this case, a binary number stored in the shift register is a first segmentation point. Another segmentation point may be generated by cyclically moving the binary number in the shift register by 1 bit in sequence in a direction of an arrow in the figure. The shift register moves a maximum of n−2 times.

Figure 11:
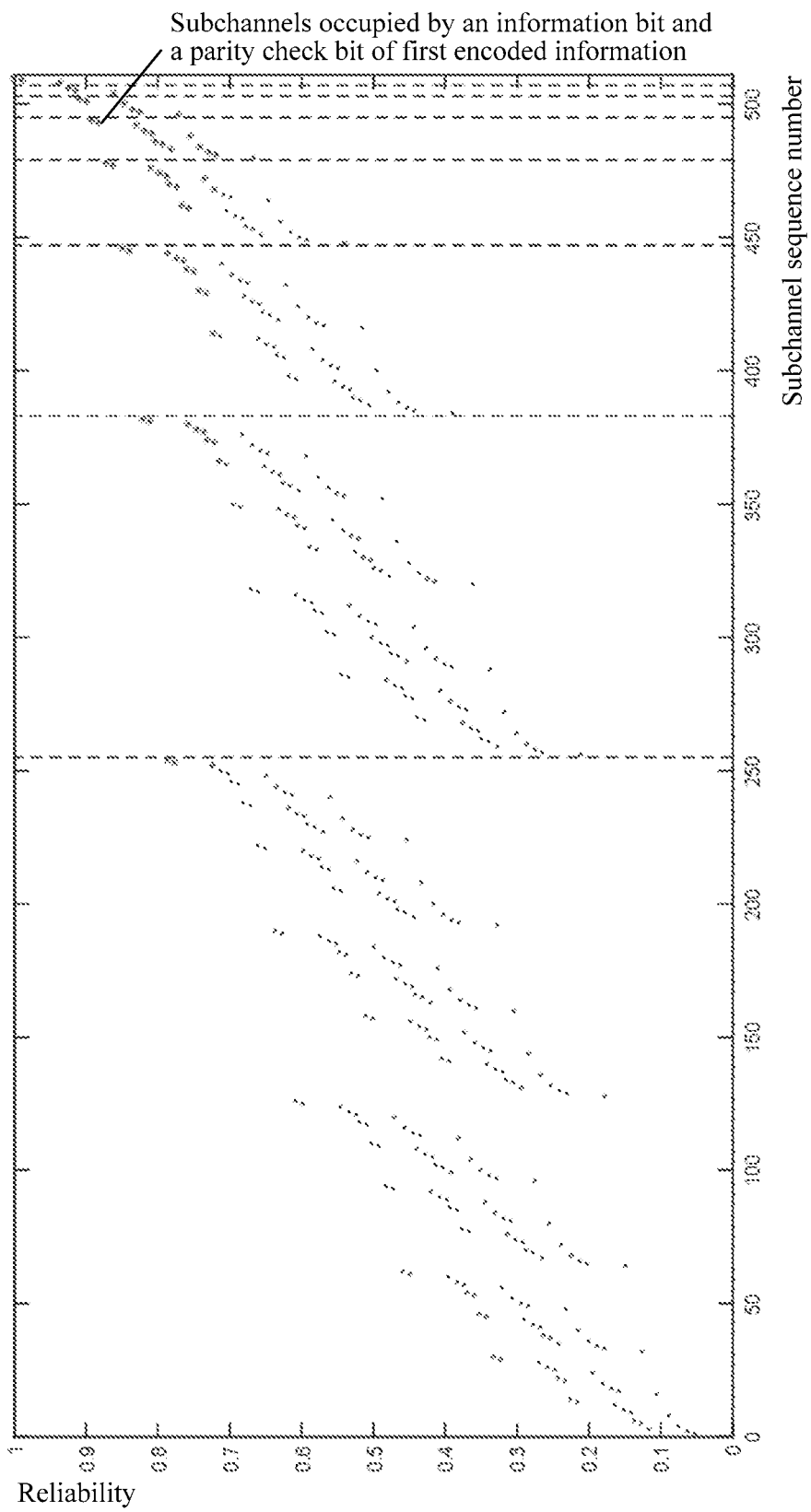
FIG. 11 is a schematic diagram of reliability of subchannels according to an embodiment of this application.

FIG. 11 shows distribution of reliability of the subchannels, and a dashed line indicates a segmentation point. According to the example 1, when N=512, seven segmentation points may be generated, and the segmentation points generated based on the shift register are respectively: the first segmentation point $B_1$=(011111111) binary (BIN)= (255) decimal (DEC); the second segmentation point $B_2$= (101111111) BIN=(383) DEC; the third segmentation point $B_3$=(110111111) BIN=(447) DEC; the fourth segmentation point $B_4$=(111011111) BIN=(479) DEC; the fifth segmentation point $B_5$=(111101111) BIN=(495) DEC; the sixth segmentation point $B_6$=(111110111) BIN=(503) DEC; and the seventh segmentation point $B_7$=(111111011) BIN=(507) DEC.

(b) Determine sequence numbers of the subchannels to which the information bit and the PC frozen bit of the first encoded information are allocated.

The sequence numbers that are of the subchannels occupied by the information bit and the PC frozen bit of the first encoded information and that are included in each segment are less than or equal to the segmentation point, and do not belong to a previous segment.

According to example 1, as shown in FIG. 11, dots in the figure represent the reliability of the subchannels. FIG. 11 shows the reliability of the subchannels occupied by the information bit and the PC frozen bit of the first encoded information. The subchannels occupied by the information bit and the PC frozen bit of the first encoded information may respectively have the following sequence numbers: [252 253 254|366 373 374 377 378 380 381 382|414 429 430 437 438 441 442 444 445 446|461 462 468 469 470 472 473 474 476 477 478|481 482 483 484 485 486 488 489 490 492 493 494|496 497 498 500 501 502|504 505 506|508 509 510].

It can be learned that, quantities $G_g$ of subchannels to which information bits and PC frozen bits of the first encoded information are allocated in the segments are respectively: G1=3; G2=8; G3=10; G4=11; G5=12; G6=6; G7=3; and G8=3.

(c) Determine a sequence number of a subchannel to which the PC frozen bit is allocated.

In the sequence number set of the subchannels to which the information bit and the PC frozen bit of the first encoded information are allocated in each segment, subchannels corresponding to first $Pf_g$ sequence numbers, subchannels corresponding to last $Pf_g$ sequence numbers, or subchannels corresponding to middle $Pf_g$ sequence numbers may be determined as subchannels corresponding to PC frozen bits, where g is a segment sequence number, $Pf_g$ is a nonnegative integer, and g is a positive integer greater than or equal to 1.

According to the example 1, it is assumed that, quantities $Pf_g$ of subchannels to which the PC frozen bit is allocated in the subchannels to which the information bits and the PC frozen bit of the first encoded information are allocated in the segments are respectively $Pf_1$=1, $Pf_2$=2, $Pf_3$=3, $Pf_4$=3, $Pf_5$=3, $Pf_6$=2, $Pf_7$=1, and $Pf_8$=1, and the subchannels to which the PC frozen bit is allocated are first $Pf_g$ subchannels in the subchannels to which the information bit and the PC frozen bit of the first encoded information are allocated in the segments, the sequence numbers of the subchannels to which the PC frozen bit is allocated are [252, 366, 373, 414, 429, 430, 468, 472, 461, 481, 482, 484, 496, 497, 504, 508].

(d) Determine a subchannel to which the frozen bit is allocated.

The transmit end may determine that a subchannel that is in the subchannels that is different from subchannels corresponding to the information bit, the PC frozen bit, and the punctured bit of the first encoded information is the subchannel to which the frozen bit is allocated; or the transmit end determines that a subchannel that is in the subchannels that is different from subchannels corresponding to the information bit, the PC frozen bit, and the shortened bit of the first encoded information is the subchannel of the frozen bit.

After determining the subchannels to which the information bit, the PC frozen bit, the punctured bit, and the frozen bit of the first encoded information are allocated, the transmit end may add the information bit, the PC frozen bit, the punctured bit, and the frozen bit of the first encoded information to the subchannels, to obtain the second encoded information. A bit value on the subchannel to which the frozen bit is allocated may be set to 0 by default by the receive end and the transmit end.

504. The transmit end performs polar encoding on the second encoded information, to obtain third encoded information and output the third encoded information to a receive end.

The transmit end may perform polar code encoding on the second encoded information by using a polar encoder, remove the punctured bit or the shortened bit from a result obtained after polar encoding, to obtain the third encoded information, and then output the third encoded information to the receive end.

505. The receive end obtains, by using a PC-SCL decoder, decoding values of paths after to-be-decoded information is decoded.

The to-be-decoded information is the third encoded information sent by the transmit end.

The PC-SCL decoder may obtain decoding values of L paths, and a value of L may be equal to a positive integer n. For example, if L=8, the receive end may obtain decoding values of eight paths by using the PC-SCL decoder. A decoding value of each path includes an information bit and a cyclic redundancy check bit, the information bit is the information bit of the to-be-encoded information, and the cyclic redundancy check bit may include the first cyclic redundancy check bit and the second cyclic redundancy check bit.

506. The receive end aids, by using a second cyclic redundancy check bit, the PC-SCL decoder in selecting any path.

When checking the decoding values of the paths, the receive end may aid, by using the second cyclic redundancy check bit in the decoding values of the paths, the PC-SCL decoder in selecting the any path, and then check the path in step 507.

507. The receive end checks an information bit of the any path by using a first cyclic redundancy check bit of the any path, and when the information bit of the any path is checked to be correct, determines the information bit as an information bit of a path on which a cyclic redundancy check succeeds.

To be specific, the receive end checks the information bit of the path based on the first cyclic redundancy check bit in a decoding result of the path selected in step 506. If the check performed on the information bit of the path by using the first cyclic redundancy check bit of the path succeeds, the information bit is determined as the information bit of the path on which the cyclic redundancy check succeeds, namely, a finally output information bit.

In this way, on the encoding side, the transmit end performs both the cyclic redundancy check and the PC frozen encoding before the polar encoding, and on the decoding side, the receive end outputs a decoding result obtained after the PC frozen check succeeds and the cyclic redundancy check succeeds. In comparison with the prior art in which on the encoding side, only the cyclic redundancy check is performed or only the PC frozen encoding is performed, and on the decoding side, a decoding result obtained after only the PC frozen check succeeds or the cyclic redundancy check succeeds is output, in this embodiment of this application, double encoding and double checks are performed. To be specific, CRC encoding is performed once only before PC polar encoding by using CRC-aided PC polar encoding, and an operation of selecting a path by using a CRC is added only after PC-SCL decoding by using CRC-aided PC polar decoding. This can improve an error detection capability during decoding, and improve encoding and polar code decoding performance.

The foregoing describes solutions provided in the embodiments of this application mainly from the perspective of the transmit end and the receive end. It may be understood that, to implement the foregoing functions, the transmit end and the receive end include a corresponding hardware structure and/or software module for performing each function. A person skilled in the art should be readily aware that this application can be implemented in a form of hardware or in a form of a combination of hardware and computer software with reference to the algorithm steps described in the embodiments disclosed in this specification. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this application.

In the embodiments of this application, the transmit end and the receive end may be divided into function modules according to the foregoing method examples. For example, each function module may be obtained based on each corresponding function, or two or more functions may be integrated into a processing module. The integrated module may be implemented in a form of hardware, or may be implemented in a form of a software function module. It should be noted that the division of the modules in the embodiments of this application is an example, and is merely logical function division, and there may be another division manner during actual implementation.

Figure 12:
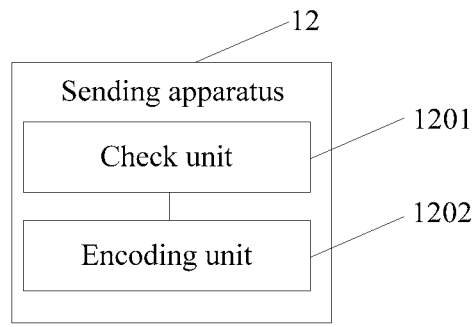
FIG. 12 is a schematic structural diagram of a sending apparatus according to an embodiment of this application.

When each function module is obtained based on each corresponding function, FIG. 12 shows a possible schematic structural diagram of a sending apparatus 12 in the foregoing embodiment. The sending apparatus 12 includes a check unit 1201 and an encoding unit 1202. The check unit 1201 is configured to support the sending apparatus in performing a step 501 in FIG. 5, and the encoding unit 1202 is configured to support the sending apparatus in performing steps 502, 503, and 504 in FIG. 5. All related content of the steps in the foregoing method embodiment may be cited in function descriptions of corresponding function modules. Details are not described herein again.

When an integrated unit is used, FIG. 3 shows a possible schematic structural diagram of a transmit end in the foregoing embodiment. A processing module 301 may be a processor or a controller, such as a central processing unit (CPU), a general purpose processor, a digital signal processor (DSP), an application-specific integrated circuit (ASIC), a field programmable gate array (FPGA), or another programmable logical device, a transistor logical device, a hardware component, or a combination thereof. The processing module 301 may implement or execute various example logical blocks, modules, and circuits described with reference to content disclosed in this application. Alternatively, the processing module 301 may be a combination for implementing a computing function, for example, a combination of one or more microprocessors, or a combination of the DSP and a microprocessor. A communications module 302 may be a transceiver, a transceiver circuit, a communications interface, or the like. A storage module 303 may be a memory.

Figure 13:
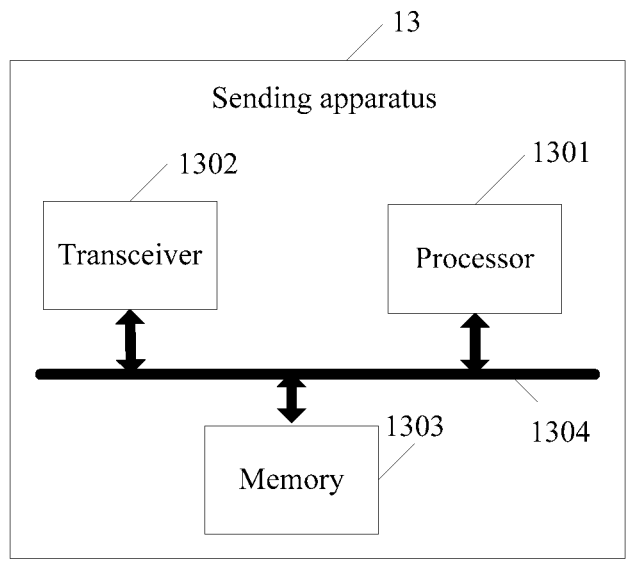
FIG. 13 is a schematic structural diagram of a sending apparatus according to an embodiment of this application.

When the processing module 301 is a processor, the communications module 302 is a transceiver, and the storage module 303 is a memory, the transmit end in the embodiments of this application may be a sending apparatus shown in FIG. 13.

As shown in FIG. 13, a sending apparatus 13 includes: a processor 1301, a transceiver 1302, a memory 1303, and a bus 1304. The transceiver 1302, the processor 1301, and the memory 1303 are interconnected by using the bus 1304. The bus 1304 may be a peripheral component interconnect (PCI) bus, an extended industry standard architecture (EISA) bus, or the like. The bus may be classified into an address bus, a data bus, a control bus, and the like. For ease of representation, only one bold line is used to represent the bus in FIG. 13, but this does not mean that there is only one bus or only one type of bus.

Figure 14:
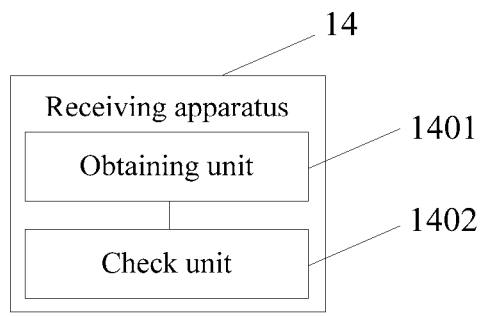
FIG. 14 is a schematic structural diagram of a receiving apparatus according to an embodiment of this application.

When each function module is obtained based on each corresponding function, FIG. 14 shows a possible schematic structural diagram of a receiving apparatus 14 in the foregoing embodiment. The receiving apparatus includes an obtaining unit 1401 and a check unit 1402. The obtaining unit 1401 is configured to support the receiving apparatus in performing a step 505 in FIG. 5, and the check unit 1402 is configured to support the receiving apparatus in performing steps 506 and 507 in FIG. 5. All related content of the steps in the foregoing method embodiment may be cited in function descriptions of corresponding function modules. Details are not described herein again.

When an integrated unit is used, FIG. 4 shows a possible schematic structural diagram of a receive end in the foregoing embodiment. A processing module 401 may be a processor or a controller, for example, may be a CPU, a general purpose processor, a DSP, an ASIC, an FPGA or another programmable logic device, a transistor logic device, a hardware component, or any combination thereof. The processing module 401 may implement or execute various example logical blocks, modules, and circuits described with reference to content disclosed in this application. Alternatively, the processing module 401 may be a combination for implementing a computing function, for example, a combination of one or more microprocessors, or a combination of the DSP and a microprocessor. A communications module 402 may be a transceiver, a transceiver circuit, a communications interface, or the like. A storage module 403 may be a memory.

Figure 15:
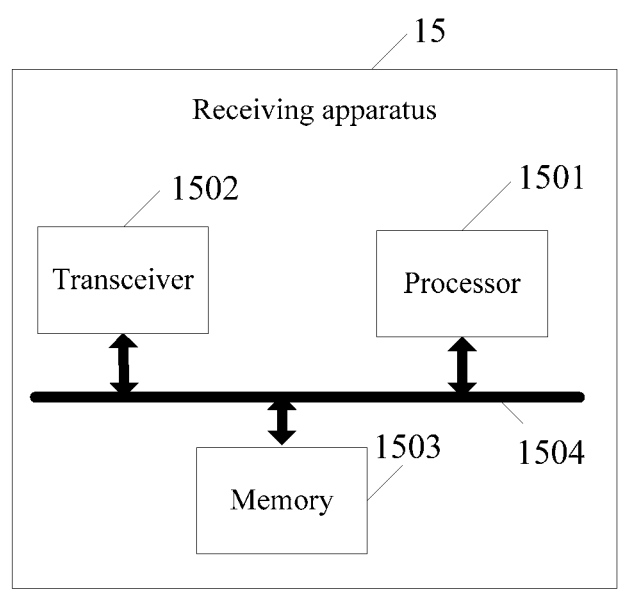
FIG. 15 is a schematic structural diagram of a receiving apparatus according to an embodiment of this application.

When the processing module 401 is a processor, the communications module 402 is a transceiver, and the storage module 403 is a memory, the receiving end in the embodiments of this application may be a receiving apparatus shown in FIG. 15.

As shown in FIG. 15, a receiving apparatus 15 includes: a processor 1501, a transceiver 1502, a memory 1503, and a bus 1504. The transceiver 1502, the processor 1501, and the memory 1503 are interconnected by using the bus 1504. The bus 1504 may be a PCI bus, an EISA bus, or the like. The bus may be classified into an address bus, a data bus, a control bus, and the like. For ease of representation, only one bold line is used to represent the bus in FIG. 15, but this does not mean that there is only one bus or only one type of bus.

Method or algorithm steps described in combination with the content disclosed in this application may be implemented by hardware, or may be implemented by executing a software instruction by a processor. The software instruction may include a corresponding software module. The software module may be stored in a random access memory (RAM), a flash memory, a read-only memory (ROM), an erasable programmable read only memory (EPROM), an electrically erasable programmable read-only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium, and can write information to the storage medium. Certainly, the storage medium may be a component of the processor. The processor and the storage medium may be located in an ASIC. In addition, the ASIC may be located in a core network interface device. Certainly, the processor and the storage medium may exist in the core network interface device as discrete devices.

A person skilled in the art should be aware that in the foregoing one or more examples, functions described in this application may be implemented by hardware, software, firmware, or any combination thereof. When the functions are implemented by software, the functions may be stored in a computer readable medium or transmitted as one or more instructions or code in a computer readable medium. The computer readable medium includes a computer storage medium and a communications medium, and the communications medium includes any medium that enables a computer program to be transmitted from one place to another place. The storage medium may be any available medium accessible to a general-purpose or special-purpose computer.

The objectives, technical solutions, and beneficial effects of this application are further described in detail in the foregoing specific implementations. It should be understood that the foregoing descriptions are merely specific implementations of this application, but are not intended to limit the protection scope of this application. Any modification, equivalent replacement, improvement, or the like made based on the technical solutions of this application shall fall within the protection scope of this application.

What is claimed is:
1. A polar encoding method, comprising:
  obtaining, by a communication device, a subchannel corresponding to a to-be-punctured bit or a to-be-shortened bit;
  determining subchannels corresponding to an information bit and a check frozen bit that are different from the subchannel corresponding to the to-be-punctured bit or the to-be-shortened bit;
  determining that a subchannel corresponding to a frozen bit that is different from the subchannels corresponding to the information bit and the check frozen bit and the subchannel corresponding to the to-be-punctured bit or the to-be-shortened bit, wherein reliability of the subchannels corresponding to the information bit and the check frozen bit is higher than reliability of the subchannel corresponding to the frozen bit;
  performing, according to the subchannels corresponding to the information bit and the check frozen bit and the subchannel corresponding to the frozen bit, parity check encoding and polar encoding to obtain encoded information;

performing rate matching on the encoded information according to the to-be-punctured bit or the to-be-shortened bit to obtain rate matched information; and sending the rate matched information.

2. The method according to claim 1, wherein reliability of a subchannel corresponding to the information bit is lower than reliability of a subchannel corresponding to the check frozen bit.

3. The method according to claim 1, wherein the subchannels include a plurality of subchannels corresponding to check frozen bits, and wherein reliabilities of the plurality of subchannels corresponding to the check frozen bits are lower than reliability of a subchannel corresponding to the information bit.

4. The method according to claim 1, wherein the information bit comprises a cyclic redundancy check (CRC) bit.

5. A communication apparatus, comprising:
at least one processor;
a non-transitory computer-readable storage medium coupled to the at least one processor and storing programming instructions for execution by the at least one processor, the programming instructions instruct the at least one processor to:
obtain a subchannel corresponding to a to-be-punctured bit or a to-be-shortened bit;
determine subchannels corresponding to an information bit and a check frozen bit that are different from the subchannel corresponding to the to-be-punctured bit or the to-be-shortened bit;
determine that a subchannel corresponding to a frozen bit that is different from the subchannels corresponding to the information bit and the check frozen bit and the subchannel corresponding to the to-be-punctured bit or the to-be-shortened bit, wherein reliability of the sub channels corresponding to the information bit and the check frozen bit is higher than reliability of the subchannel corresponding to the frozen bit;
perform, according to the subchannels corresponding to the information bit and the check frozen bit and the subchannel corresponding to the frozen bit, parity check encoding and polar encoding to obtain encoded information;
perform rate matching on the encoded information according to the to-be-punctured bit or the to-be-shortened bit to obtain rate matched information; and
cause a communications interface to output the rate matched information.

6. The communication apparatus according to claim 5, wherein reliability of a subchannel corresponding to the information bit is lower than reliability of a subchannel corresponding to the check frozen bit.

7. The communication apparatus according to claim 5, wherein the subchannels include a plurality of subchannels corresponding to check frozen bits, and wherein reliabilities of the plurality of subchannels corresponding to the check frozen bits are lower than reliability of a subchannel corresponding to the information bit.

8. The communication apparatus according to claim 5, wherein the information bit comprises a cyclic redundancy check (CRC) bit.

9. A non-transitory computer readable storage medium, comprising one or more programming instructions, wherein when the one or more programming instructions run on a computer, the one or more programming instructions cause the computer to:
obtain a subchannel corresponding to a to-be-punctured bit or a to-be-shortened bit;
determine subchannels corresponding to an information bit and a check frozen bit that are different from the subchannel corresponding to the to-be-punctured bit or the to-be-shortened bit;
determine that a subchannel corresponding to a frozen bit that is different from the subchannels corresponding to the information bit and the check frozen bit and the subchannel corresponding to the to-be-punctured bit or the to-be-shortened bit, wherein reliability of the sub channels corresponding to the information bit and the check frozen bit is higher than reliability of the subchannel corresponding to the frozen bit;
perform, according to the subchannels corresponding to the information bit and the check frozen bit and the subchannel corresponding to the frozen bit, parity check encoding and polar encoding to obtain encoded information;
perform rate matching on the encoded information according to the to-be-punctured bit or the to-be-shortened bit to obtain rate matched information; and
output the rate matched information.

10. The non-transitory computer readable storage medium according to claim 9, wherein reliability of a subchannel corresponding to the information bit is lower than reliability of a subchannel corresponding to the check frozen bit.

11. The non-transitory computer readable storage medium according to claim 9, wherein the subchannels include a plurality of subchannels corresponding to check frozen bits, and wherein reliabilities of the plurality of subchannels corresponding to the check frozen bits are lower than reliability of a subchannel corresponding to the information bit.

12. The non-transitory computer readable storage medium according to claim 9, wherein the information bit comprises a cyclic redundancy check (CRC) bit.

* * * * *